United States Patent
Fukumoto et al.

(10) Patent No.: US 10,214,814 B2
(45) Date of Patent: Feb. 26, 2019

(54) SUBSTRATE TREATING APPARATUS AND TREATMENT GAS SUPPLYING NOZZLE

(71) Applicant: SCREEN Holdings Co., Ltd., Kyoto (JP)

(72) Inventors: Yasuhiro Fukumoto, Kyoto (JP); Koji Nishi, Kyoto (JP); Toru Momma, Kyoto (JP); Shigehiro Goto, Kyoto (JP); Atsushi Tanaka, Kyoto (JP); Kenichiro Jo, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 259 days.

(21) Appl. No.: 15/079,930

(22) Filed: Mar. 24, 2016

(65) Prior Publication Data
US 2016/0281235 A1    Sep. 29, 2016

(30) Foreign Application Priority Data
Mar. 26, 2015    (JP) .................................. 2015-064588

(51) Int. Cl.
  *C23C 16/455* (2006.01)
  *H01L 21/67* (2006.01)
  *H01L 21/687* (2006.01)

(52) U.S. Cl.
  CPC .... *C23C 16/45563* (2013.01); *H01L 21/6715* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 6,158,679 A | 12/2000 | Ohmi et al. | .................. 239/589 |
| 2005/0087138 A1* | 4/2005 | Ueno | .................... C23C 14/568 |
| | | | 204/298.04 |

(Continued)

FOREIGN PATENT DOCUMENTS

| | | |
|---|---|---|
| JP | 2000-150332 | 5/2000 |
| JP | 2000-150332 A | 5/2000 |

(Continued)

OTHER PUBLICATIONS

Office Action dated Jun. 3, 2017 issued in corresponding Taiwan Patent Application No. 105109404.

*Primary Examiner* — Jethro M. Pence
(74) *Attorney, Agent, or Firm* — Ostrolenk Faber LLP

(57) ABSTRACT

Substrate treating apparatus including a cover that covers a substrate on a plate. The cover undersurface is substantially horizontal and adjacent to a surface of the substrate. Through a gas flow path, a treatment gas is supplied to the substrate. The gas flow path includes a swirl chamber, a diameter contraction chamber, and a diameter expansion chamber. In the swirl chamber, the treatment gas flows around the central axis. The diameter contraction chamber is disposed below and in communication with the swirl chamber, and has an inner diameter that decreases from its upper end toward its lower end. The diameter expansion chamber is disposed below and in communication with the diameter contraction chamber, and has an inner diameter that increases from its upper end toward its lower end. The lower end of the diameter expansion chamber includes an opening on the undersurface of the cover.

19 Claims, 8 Drawing Sheets

(56) References Cited

U.S. PATENT DOCUMENTS

2014/0112739 A1* 4/2014 Hirano et al. ...... H01L 21/6719
  118/715
2014/0235069 A1* 8/2014 Breiling et al. ........ G03F 7/162
  355/27

FOREIGN PATENT DOCUMENTS

| KR | 10-0680439 | 2/2007 |
| KR | 10-2014-0009593 | 1/2014 |
| TW | 410253 | 11/2000 |
| WO | WO 2008/052047 A2 | 5/2008 |

* cited by examiner

EXAMPLE

Fig. 8B COMPARATIVE EXAMPLE

INTRODUCTION FLOW RATE
= 1.5 L/min

INTRODUCTION FLOW RATE
= 3.0 L/min

INTRODUCTION FLOW RATE
= 5.0 L/min

SUBSTRATE TREATING APPARATUS AND TREATMENT GAS SUPPLYING NOZZLE

CROSS-REFERENCE TO RELATED APPLICATIONS

This application claims priority to Japanese Patent Application No. 2015-064588 filed Mar. 26, 2015, the disclosure of which is hereby incorporated herein by reference in its entirety for all purposes.

BACKGROUND OF THE INVENTION

1. Field of the Invention

The present invention relates to a substrate treating apparatus and a treatment gas supplying nozzle for supplying a treatment gas to a semiconductor substrate, a glass substrate for photomask, a glass substrate for liquid crystal display, an optical disk substrate, and the like (hereinafter, simply referred to as a "substrate").

2. Description of the Related Art

Examples of such a substrate treating apparatus include an apparatus that performs a hydrophobic treatment for enhancing adhesion between a resist and a substrate. This is disclosed, for example, in Japanese Unexamined Patent Publication No. 2000-150332A. The apparatus includes a plate, a lid, and a gas introduction port. The substrate is placed on the plate for controlling a temperature of the substrate. The lid is disposed above the plate so as to be movable vertically. The gas introduction port is disposed in the lid for supplying a treatment gas containing hexamethyldisilazane (hereinafter, referred to as "HMDS"). In the apparatus, the substrate is placed on the plate, and the substrate placed on the plate is covered with the lid. Then, the gas introduction port supplies the treatment gas to the substrate on the plate while the plate controls the temperature of the substrate. Accordingly, the substrate is coated with HMDS.

However, the example of the currently-used apparatus with such a construction has the following drawback. That is, it has some difficulty in spraying HMDS uniformly to the entire surface of the substrate. Non-uniform coating with HMDS may cause an inappropriate adhesive function of the resist.

For instance, when a vertical pipe is connected to a primary side of the gas introduction port, uneven coating with HMDS is likely to occur between one part of the substrate immediately below the gas introduction port and the other part of the substrate. Moreover, when a horizontal pipe is connected to the gas introduction port via an elbow pipe, uneven coating with HMDS is likely to occur between one part of the substrate immediately below the gas introduction port or another part of the substrate extending in one direction from the part, and the other part of the substrate.

A substrate having a large size causes a long distance by which the treatment gas flows on the substrate, leading to an increased area to which the treatment gas is supplied. Consequently, a large sized substrate may lead to more uneven coating with the HMDS.

SUMMARY OF THE INVENTION

The present invention has been made regarding the state of the art noted above, and its one object is to provide a substrate treating apparatus and treatment gas supplying nozzle that achieve enhanced uniformity of supplying a treatment gas to a substrate.

The present invention is constituted as stated below to achieve the above object. A first aspect of the present invention provides a substrate treating apparatus. The substrate treating apparatus includes a plate that places a substrate thereon substantially horizontally; and a cover that covers an upper side of the substrate on the plate. The cover includes an undersurface that is substantially horizontal and adjacent to a surface of the substrate; and a gas flow path through which a treatment gas is supplied to the substrate. The gas flow path includes a swirl chamber having a cylindrical shape with a substantially vertical central axis, and in which the treatment gas flows around the central axis, and a diameter contraction chamber disposed below the swirl chamber and in communication with the swirl chamber, and whose inner diameter decreases from its upper end toward its lower end; and a diameter expansion chamber disposed below the diameter contraction chamber and in communication with the diameter contraction chamber, whose inner diameter increases from its upper end toward its lower end, and the lower end of the diameter expansion chamber includes an opening on the undersurface of the cover.

The treatment gas flows downward from the swirl chamber to the diameter contraction chamber, and then flows downward from the diameter contraction chamber to the diameter expansion chamber. The swirl chamber allows the treatment gas to flow in a swirl manner (in a helical manner) around the central axis. Here, the central axis is a virtual line. The diameter contraction chamber restricts a circling radius of the treatment gas. The circling radius of the treatment gas acceptable in the diameter contraction chamber becomes smaller as the treatment gas flow downward in the diameter contraction chamber. The diameter expansion chamber relieves the restriction of the circling radius of the treatment gas. The circling radius of the treatment gas acceptable in the diameter expansion chamber becomes larger as the treatment gas flows downward in the diameter expansion chamber. Then the treatment gas is ejected from the lower end of the diameter expansion chamber below the cover. The treatment gas discharged from the gas flow path flows downward, and spreads outward in a substantially horizontal direction by a centrifugal force. Consequently, the treatment gas smoothly travels between the surface of the substrate on the plate and the undersurface of the cover in every direction from the center of the substrate toward a periphery edge of the substrate. This allows more uniform supply of the treatment gas to the entire surface of the substrate.

In the non-limiting example above of the present invention, it is preferred that the central axis of the swirl chamber passes through the substantial center of the substrate on the plate. In the swirl chamber, the treatment gas flows around the substantially vertical central axis passing through the substantial center of the substrate. Accordingly, the treatment gas can be dispersed more smoothly from the center of the substrate toward the periphery edge of the substrate. This allows more uniform supply of the treatment gas to the entire surface of the substrate.

In the non-limiting example above of the present invention, it is preferred that the central axis of the diameter contraction chamber is common to the central axis of the swirl chamber, and that the central axis of the diameter expansion chamber is common to the central axis of the swirl chamber. The treatment gas readily flows in the diameter contraction chamber and the diameter expansion chamber around the substantial central axis that passes the substantial center of the substrate. This allows more uniform supply of the treatment gas to the entire surface of the substrate.

In the non-limiting example mentioned above of the present invention, it is preferred that the opening on the lower end of the diameter expansion chamber faces to the middle of the substrate. Accordingly, the treatment gas can be dispersed from the center of the substrate to the periphery edge of the substrate, achieving more uniform supply of the treatment gas to the entire surface of the substrate.

In the non-limiting example mentioned above of the present invention, it is preferred that the inner diameter at the lower end of the diameter expansion chamber is larger than the inner diameter of the swirl chamber. The diameter expansion chamber allows the treatment gas to be guided until the circling radius of the treatment gas becomes relatively large. This allows the treatment gas to spread smoothly in the substantially horizontal direction when the treatment gas is discharged from the diameter expansion chamber (gas flow path).

In the non-limiting example mentioned above of the present invention, the substrate treating apparatus further includes a small diameter chamber disposed between the diameter contraction chamber and the diameter expansion chamber. The small diameter chamber has a cylindrical shape whose inner diameter is substantially equal to or less than the inner diameter at the lower end of the diameter contraction chamber. The small diameter chamber allows suitable increase of a speed component of the treatment gas in a substantially vertical and downward direction. This causes an increased initial speed of the treatment gas discharged from the diameter expansion chamber (gas flow path), whereby the treatment gas can reach to the periphery edge of the substrate rapidly.

In the non-limiting example mentioned above of the present invention, it is preferred that the apparatus further includes an introduction port that introduces the treatment gas into the swirl chamber in a direction away from the central axis of the swirl chamber. The introduction port allows suitable generation of flow of the treatment gas around the central axis in the swirl chamber.

In the non-limiting example mentioned above of the present invention, it is preferred that the cover substantially seals a treating space on the plate. The treating space is used for treating the substrate. Substantial sealing of the treating space allows uniform supply of the treatment gas to the surface of the substrate.

In the non-limiting example mentioned above of the present invention, it is preferred that the substrate treating apparatus further includes an exhaust channel for exhausting the gas over the substrate placed on the plate outward from the periphery edge of the substrate. Exhausting the treatment gas on the substrate outward from the periphery edge of the substrate allows more enhanced flow of the treatment gas from the center of the substrate to the periphery edge of the substrate. This allows the treatment gas to flow over the surface of the substrate more smoothly, achieving more uniform supply of the treatment gas to the entire surface of the substrate.

A second aspect of the present invention provides a treatment gas supplying nozzle for supplying a treatment gas containing either a solvent or a hydrophobic treatment agent to a substrate. The treatment gas supplying nozzle includes a swirl chamber having a cylindrical shape, and in which the treatment gas flows around a central axis in the cylindrical shape; a diameter contraction chamber in fluid communication with the swirl chamber; and a diameter expansion chamber in fluid communication with the diameter contraction chamber. The swirl chamber, the diameter contraction chamber, and the diameter expansion chamber are disposed in this order in one direction along the central axis. An inner diameter of the diameter contraction chamber decreases in the one direction along the central axis. An inner diameter of the diameter expansion chamber increases in the one direction along the central axis.

The treatment gas flows in the swirl chamber, the diameter contraction chamber, and the diameter expansion chamber, in this order. The swirl chamber allows the treatment gas to flow in a swirl manner around the central axis. The diameter contraction chamber restricts a circling radius of the treatment gas. The diameter expansion chamber relieves the restriction of the circling radius of the treatment gas. The treatment gas discharged from the treatment gas supplying nozzle actively spreads in an orthogonal direction relative to the central axis of the swirl chamber while travelling in the one direction along the central axis of the swirl chamber. Such a treatment gas supplying nozzle allows uniform supply of the treatment gas, thereby allowing more uniform supply of the treatment gas to the entire surface of the substrate when the treatment supply nozzle faces to the substrate.

In the non-limiting example mentioned above of the present invention, it is preferred that the treatment gas supplying nozzle includes an introduction port that introduces the treatment gas in a direction away from the central axis of the swirl chamber. This allows the swirl chamber to generate vortex flow of the treatment gas effectively.

In the non-limiting example mentioned above of the present invention, it is preferred that the central axis of the swirl chamber is substantially vertical, the diameter contraction chamber is disposed below the swirl chamber, the inner diameter of the diameter contraction chamber decreases toward downward, the diameter expansion chamber is disposed below the diameter contraction chamber, and the inner diameter of the diameter expansion chamber increases toward downward. The treatment gas flows downward in a spiral manner in the treatment gas supplying nozzle. This allows the treatment gas discharged from the treatment gas supplying nozzle to spread readily in the substantially horizontal direction.

In the non-limiting example mentioned above of the present invention, it is preferred that the treatment gas supplying nozzle discharges the treatment gas from the diameter expansion chamber. The treatment gas discharged from the diameter expansion chamber readily spreads in the substantially horizontal direction.

Moreover, the present specification also discloses the invention concerning a treatment gas supplying nozzle as under.

Supplement 1. Disclosed is a treatment gas supplying nozzle for supplying a treatment gas containing either a solvent or a hydrophobic treatment agent to a substrate. The treatment gas supplying nozzle includes a swirl chamber in a cylindrical shape with a substantial vertical central axis in which the treatment gas flows around the central axis; a diameter contraction chamber disposed below the swirl chamber and in fluid communication with the swirl chamber, and whose inner diameter decreases from its upper end to its lower end; and a diameter expansion chamber disposed below the diameter contraction chamber and in fluid communication with the diameter contraction chamber, whose inner diameter increases from its upper end to its lower end, and that discharges the treatment gas from the lower end.

With the treatment gas supplying nozzle according to the above Supplement 1, the treatment gas flows downward in the swirl chamber, the diameter contraction chamber, and the diameter expansion chamber, in this order. The swirl chamber allows the treatment gas to flow in a swirl manner around the central axis. The diameter contraction chamber restricts a circling radius of the treatment gas. The diameter expansion chamber relieves the restriction of the circling radius of the treatment gas. The treatment gas is discharged from the lower end of the diameter expansion chamber. The discharged treatment gas spreads itself outward in the substantially horizontal direction. Such a treatment gas supplying nozzle allows uniform supply of the treatment gas, thereby achieving more uniform supply of the treatment gas to the entire surface of the substrate when the treatment gas supplying nozzle faces to the substrate.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 8B illustrates flow lines of a treatment gas in the comparative example.

DESCRIPTION OF THE PREFERRED EMBODIMENTS

Figure 1:
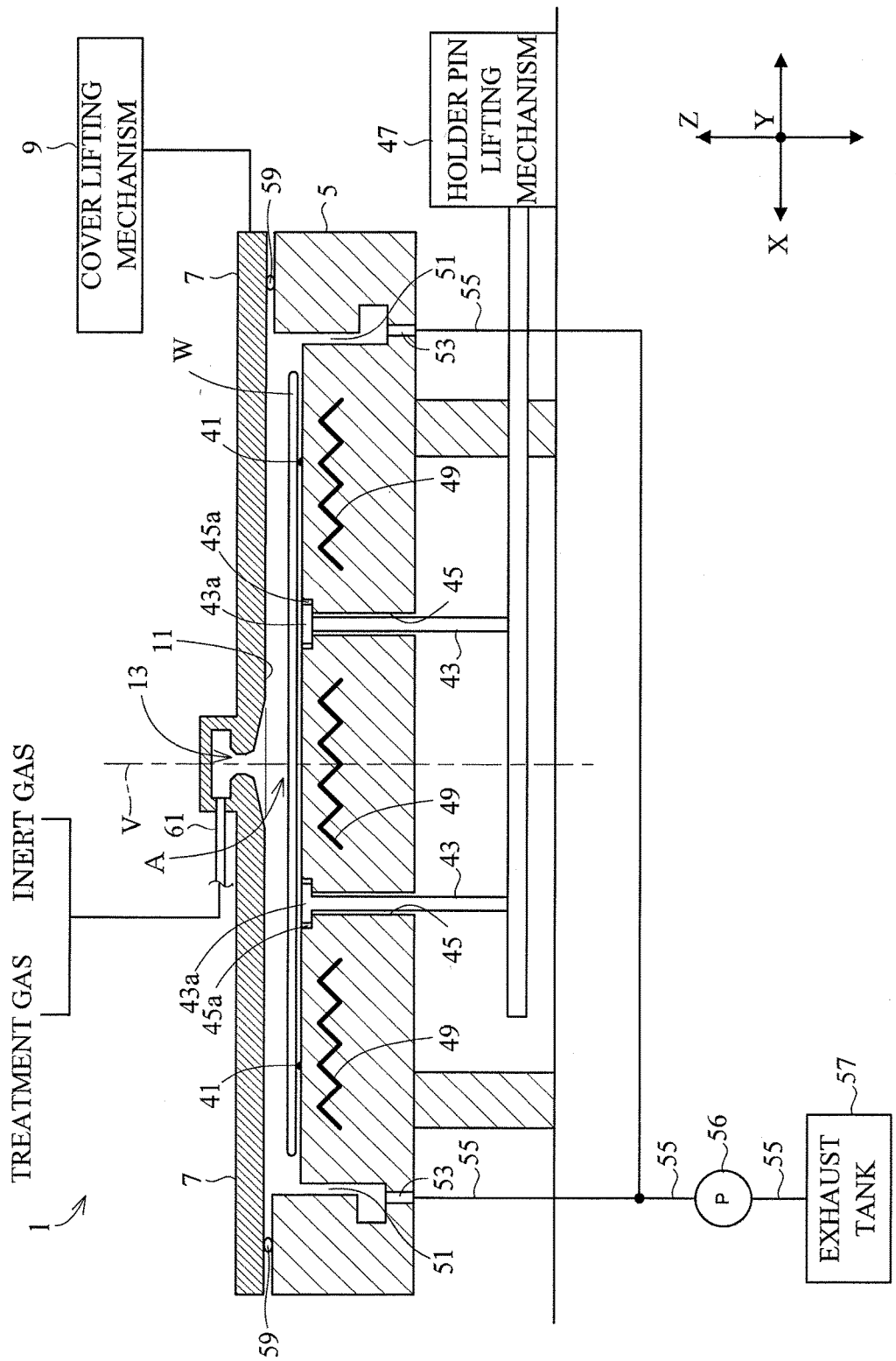
FIG. 1 is a vertical sectional view schematically illustrating a substrate treating apparatus according to one embodiment of the present invention.

The following describes one embodiment of the present invention with reference to drawings. FIG. 1 is a vertical sectional view schematically illustrating a substrate treating apparatus according to the embodiment of the present invention. A substrate treating apparatus according to Preferred Embodiment is an apparatus that performs a hydrophobic treatment to a substrate (e.g., a semiconductor wafer) W. In each drawing, symbols "X" and "Y" denote horizontal directions orthogonal to each other, and a symbol "Z" denotes a vertical direction (also referred to as a vertical direction).
<Schematic Whole Configuration>
The substrate treating apparatus 1 includes a plate 5, a cover 7, and a cover lifting mechanism 9. The plate 5 holds a substrate W placed thereon in a substantially horizontal attitude. The cover 7 is disposed above the plate 5 for covering an upper portion of the substrate W on the plate 5. The cover 7 is connected to the cover lifting mechanism 9. The cover lifting mechanism 9 lifts the cover 7 in a vertical direction Z. The cover lifting mechanism 9 is, for example, an air cylinder. The cover 7 is lifted upward, whereby the substrate W is allowed to be transported to and from the plate 5. When the cover 7 is in a lower position, the cover 7 defines a treating space A above the plate 5. In the treating space A, a hydrophobic treatment is performed to the substrate W on the plate 5. FIG. 1 illustrates the cover 7 in the lower position.

The cover 7 includes an undersurface 11 and a gas flow path 13. The undersurface 11 is substantially horizontal, and has a circular shape larger than the substrate W. When the cover 7 is in the lower position, a distance between the undersurface 11 and a top face of the plate 5 is, for example, 2 mm. The gas flow path 13 supplies the treatment gas to the substrate W.

Figure 2:
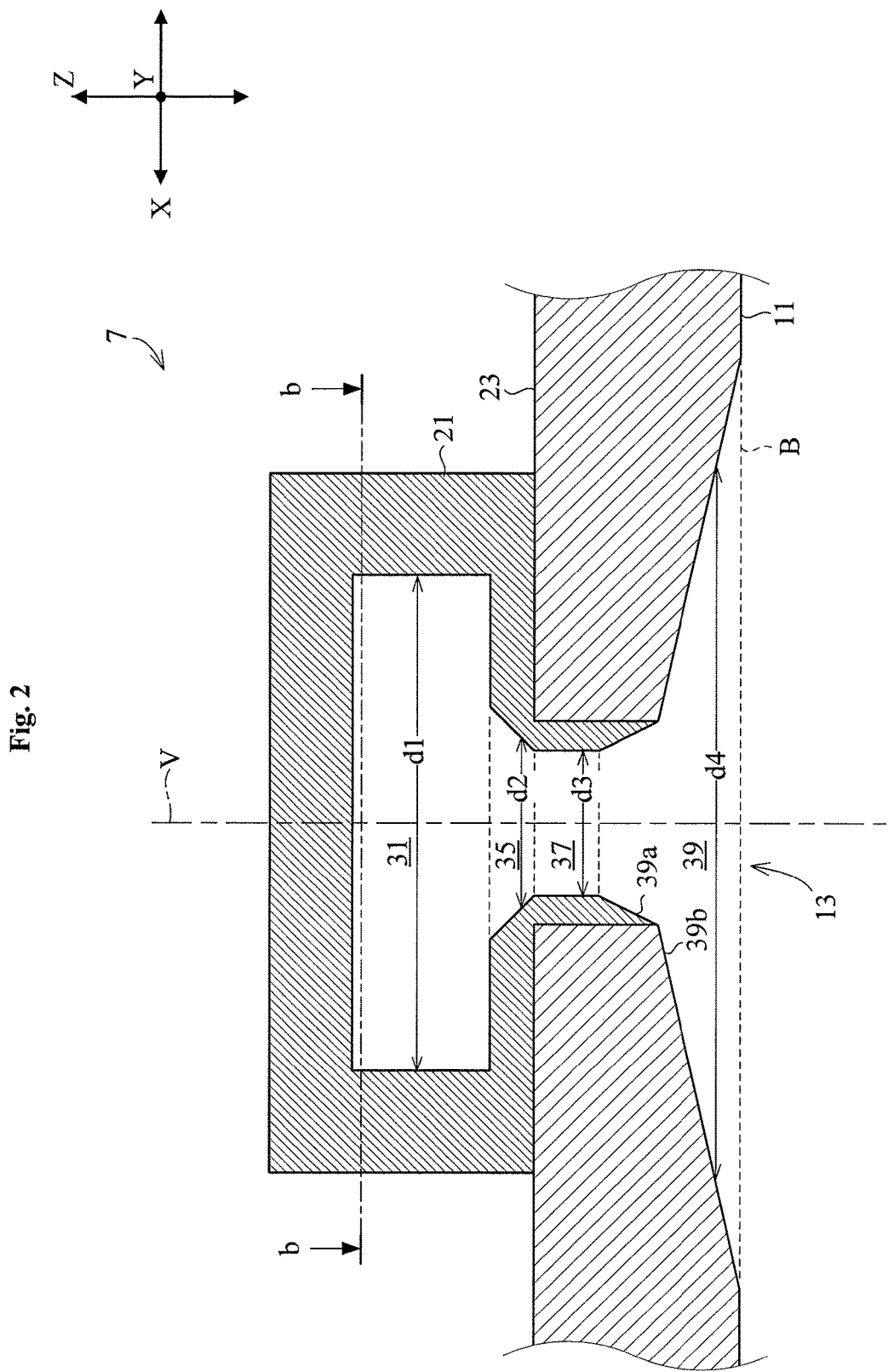
FIG. 2 is a vertical sectional view of a principal part of a cover.
Figure 3:
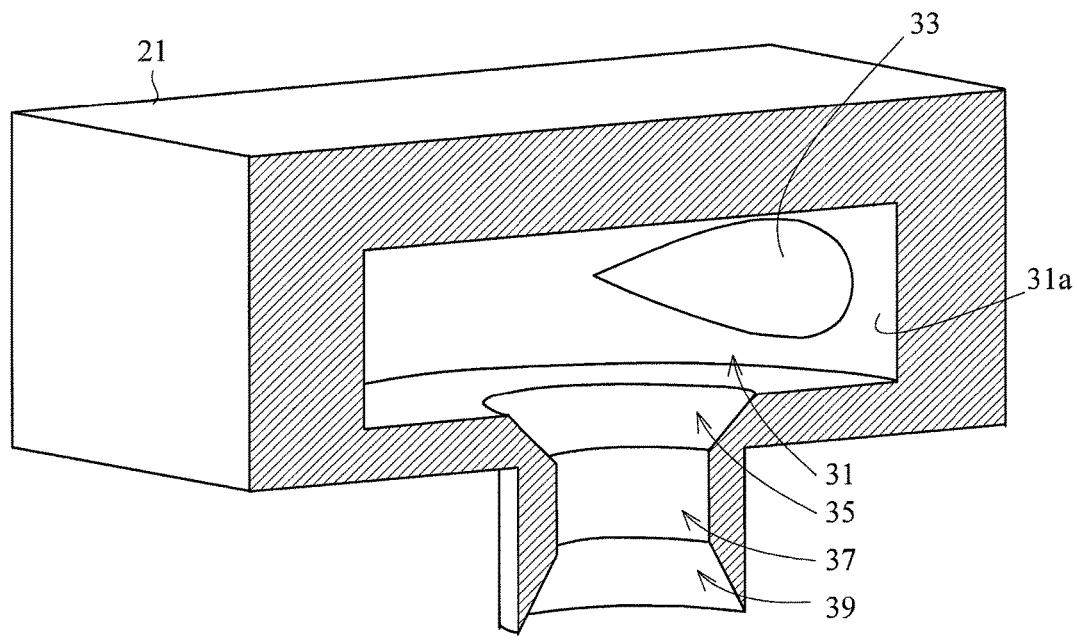
FIG. 3 is a perspective vertical sectional view of a nozzle.
Figure 4:
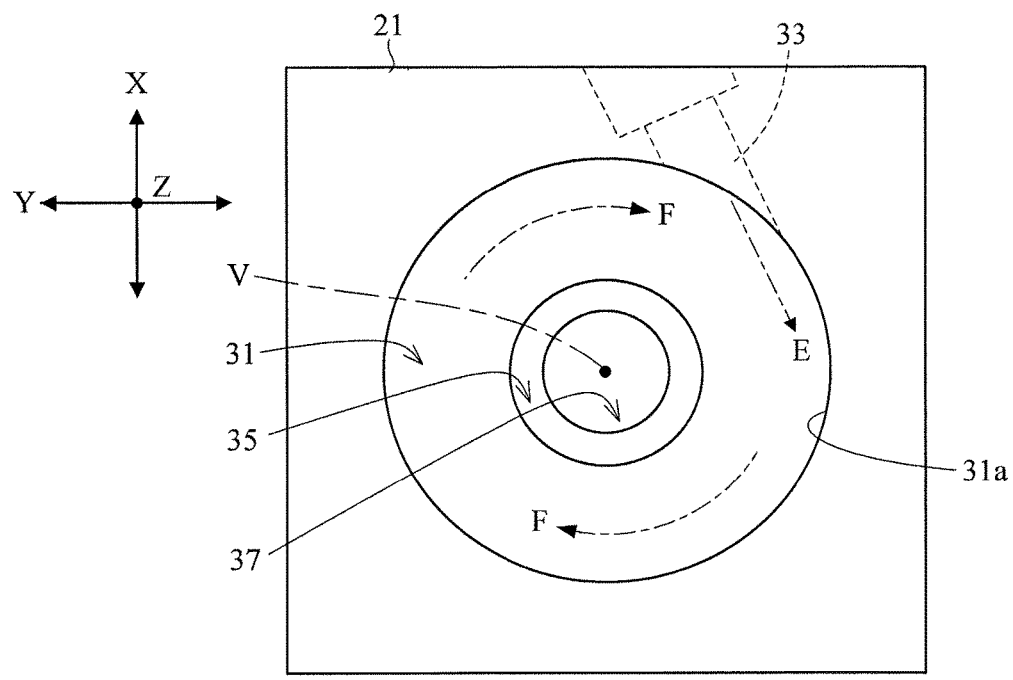
FIG. 4 illustrates a horizontal section of the nozzle.
Figure 5:
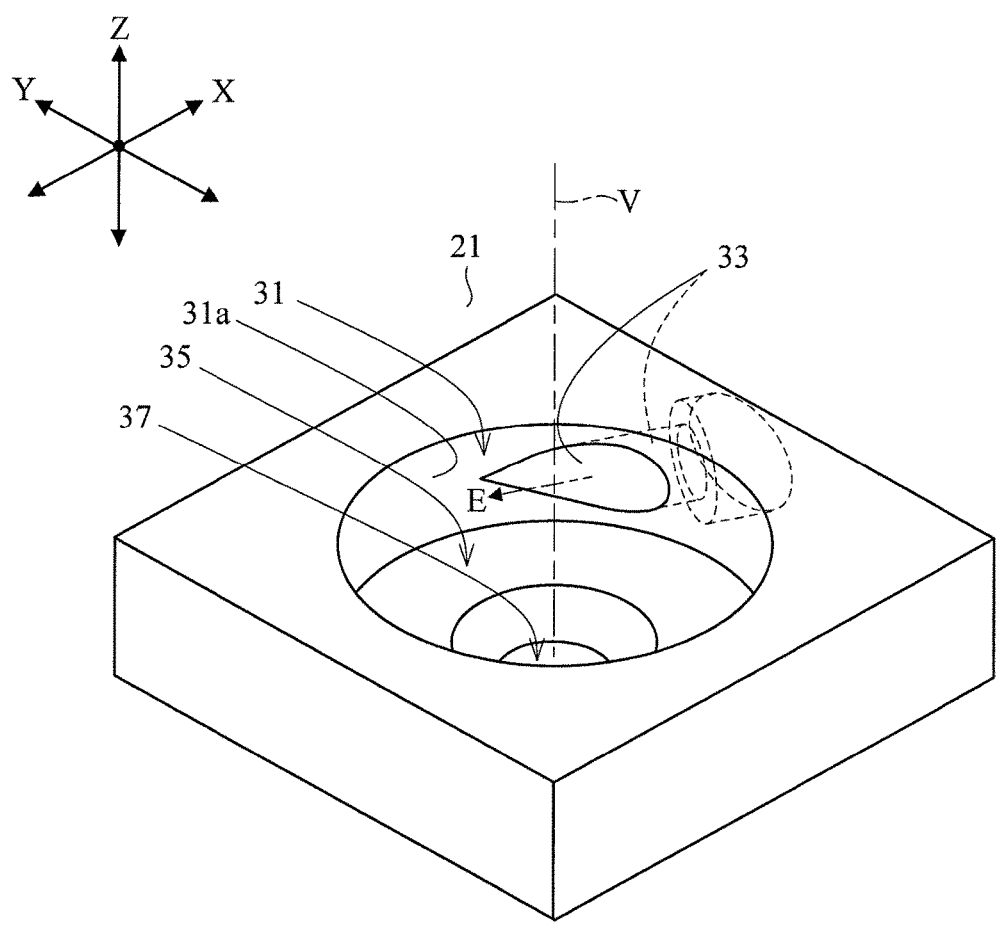
FIG. 5 is a perspective view of the horizontal section of the nozzle in FIG. 4 from the above.

The gas flow path 13 is connected to a first end of a flexible tube 61. A second end of the tube 61 is connected to a supplying section (not shown) that selectively supplies the treatment gas or an inert gas. The treatment gas contains a hydrophobic treatment agent. The hydrophobic treatment agent is, for example, HMDS. The treatment gas is, for example an HMDS gas. The inert gas is, for example, a nitrogen gas.
<Configuration of Treatment Gas Flow Path>
FIG. 2 is a vertical sectional view of a principal part of the cover 7. FIG. 3 is a perspective view of a vertical section of the nozzle. FIG. 4 is a sectional view along a b-b line in FIG. 2, i.e., a horizontal sectional view of the nozzle. FIG. 5 is a perspective view of the horizontal section of the nozzle in FIG. 4 seen from the above.

The cover 7 is formed by two members, a nozzle 21 and a cover main body 23. The nozzle 21 is attached to the middle of the cover main body 23. The undersurface 11 is formed on the cover main body 23. The gas flow path 13 is formed across the nozzle 21 and the cover main body 23. The nozzle 21 is a non-limiting example of the treatment gas supplying nozzle in the present invention.

The gas flow path 13 includes a swirl chamber 31, an introduction port 33, a diameter contraction chamber 35, a small diameter chamber 37, and a diameter expansion chamber 39. Among them, the swirl chamber 31, the introduction port 33, the diameter contraction chamber 35, and the small diameter chamber 37 are each a space formed inside the nozzle 21. One part (upper part) of the diameter expansion chamber 39 is formed in the nozzle 21, whereas the other part (lower part) of the diameter expansion chamber 39 is formed in the cover main body 23.

The swirl chamber 31 is cylindrical with a substantially vertical axis V as a central axis. The axis V passes substantially the center of the substrate W. Here, the central axis and the axis V are each a virtual line.

The introduction port 33 introduces the treatment gas into the swirl chamber 31. The introduction port 33 introduces the treatment gas into the swirl chamber 31 in a direction E away from the central axis (e.g., the axis V) of the swirl chamber 31 (see FIGS. 4 and 5). A first end of the introduction port 33 opens to a periphery surface 31a (in other words, a lateral part) of the swirl chamber 31. The direction E is preferably appropriate to a tangent line direction at a part of the peripheral surface 31a intersecting the direction E. It is preferred that the direction E is substantially horizontal. The introduction port 33 is a horizontal flow path that extends linearly. The introduction port 33 has an inner diameter sufficiently smaller than that of the swirl chamber 31. The inner diameter of the introduction port 33 is, for example, one-fifth or less of the inner diameter d1 of the swirl chamber 31. Moreover, the introduction port 33 includes a second end connected to the tube 61.

The diameter contraction chamber 35 is disposed below the swirl chamber 31 and is in fluid communication with the swirl chamber 31. In the present embodiment, the diameter contraction chamber 35 adjoins the swirl chamber 31. That is, the lower surface of the swirl chamber 31 adjoins a top face of the diameter contraction chamber 35. The diameter contraction chamber 35 has a circular horizontal section. The central axis of the diameter contraction chamber 35 is common to the axis V and thus common to the central axis of the swirl chamber 31. The diameter contraction chamber 35 has an inner diameter d2 that decreases from an upper end of the diameter contraction chamber 35 to a lower end of the diameter contraction chamber 35.

The small diameter chamber 37 is disposed below the diameter contraction chamber 35 and in fluid communication with the diameter contraction chamber 35. In the present embodiment, a top face of the small diameter chamber 37 adjoins the lower surface of the diameter contraction chamber 35. The small diameter chamber 37 is cylindrical with an axis V as the central axis. The small diameter chamber 37 has an inner diameter d3 substantially equal to the inner diameter d2 at the lower end of the diameter contraction chamber 35.

The diameter expansion chamber 39 is disposed below the small diameter chamber 37 and in fluid communication with the small diameter chamber 37. In the present embodiment, a top face of the diameter expansion chamber 39 adjoins to the lower surface of the small diameter chamber 37. The diameter expansion chamber 39 has a circular horizontal section. The central axis of the diameter expansion chamber 39 is common to the axis V. The diameter expansion chamber 39 has an inner diameter d4 that increases from an upper end of the diameter expansion chamber 39 to a lower end of the diameter expansion chamber 39. The inner diameter d4 at the lower end of the diameter expansion chamber 39 is larger than the inner diameter d1 of the swirl chamber 31. In the present embodiment, a periphery surface 39a at the upper diameter expansion chamber 39 differs from the periphery surface 39b at the lower thereof in inclined angle. An inclined angle of the periphery surface 39b is closer to a horizontal plane than the inclined angle of the periphery surface 39a (see FIG. 2).

The lower end of the diameter expansion chamber 39 opens to the undersurface 11. The lower end of the diameter expansion chamber 39 corresponds to an opening B (see FIG. 2). The lower end of the diameter expansion chamber 39 (i.e., the opening B) is flush with the undersurface 11. In other words, the lower end of the diameter expansion chamber 39 is equal in level to the undersurface 11. The lower end of the diameter expansion chamber 39, i.e., the opening B faces to the middle of the surface of the substrate W placed on the plate 5.

<Configuration of Plate 5>

Reference is made to FIG. 1. The substrate treating apparatus 1 includes a plurality of (e.g., three) proximity balls 41 on the top face of the plate 5. The proximity balls 41 contact to a rear face of the substrate W for supporting the substrate W substantially horizontally. Accordingly, the proximity balls 41 spaces away the substrate W from the top face of the plate 5 by a given distance (e.g., 0.1 mm).

The substrate treating apparatus 1 includes a plurality of (e.g., three) holder pins 43 for holding the substrate W such that the substrate W is movable vertically. The plate 5 includes a plurality of (e.g., three) through holes 45 through which the plate 5 passes in the vertical direction Z. The holder pins 43 are inserted into the through holes 45 individually. Upper ends of the holder pins 43 each contact to the rear face of the substrate W. The holder pins 43 are connected to a holder pin lifting mechanism 47 below the plate 5. The holder pin lifting mechanism 47 moves the holder pins 43 vertically. This causes the holder pins 43 to move the substrate W vertically, thereby transporting the substrate W to the plate 5 (proximity balls 41) and transporting the substrate W to an external substrate transport mechanism.

The following describes one non-limiting example of a configuration that encapsulates the through holes 45. The holder pins 43 each includes an upper end connected to an encapsulate part 43a in a substantially horizontal disk shape. The through holes 45 each includes a recess 45a formed therein for accommodating the encapsulating part 43a. When the holder pin 43 is in the lower position, the encapsulating part 43a contacts to the recess 45a tightly to provide blockage between the treating space A and the through hole 45. At this time, the upper end of the holder pin 43 is in the same level as the top face of the plate 5. Accordingly, the holder pin 43 does not contact to the substrate W held with the proximity ball 41.

The substrate treating apparatus 1 includes a temperature regulator 49 that controls a temperature of the substrate W. The temperature regulator 49 is disposed inside the plate 5. The temperature regulator 49 is, for example, a heater. The temperature regulator 49 adjusts a temperature of the plate 5, whereby performing a heat treatment to the substrate W placed on the plate 5.

The plate 5 includes an annular exhaust slit 51. The exhaust slit 51 is arranged so as to surround an outside (lateral side) of the substrate W placed on the plate 5. The exhaust slit 51 is substantially annular in plan view. The exhaust slit 51 is a groove space that is recessed downward from the top face of the plate 5 and is in fluid communication with the treating space A.

The substrate treating apparatus 1 includes a plurality of (e.g., eight) exhaust ports 53 in fluid communication with the exhaust slit 51. For instance, eight exhaust ports 53 are connected to the exhaust slit 51. The exhaust ports 53 are spaced away at the same intervals along a periphery of the exhaust slit 51. The exhaust slit 51 and the exhaust ports 53 are one non-limiting example of the exhaust channel in the present invention.

The substrate treating apparatus 1 includes an exhaust pipe 55, a pump 56, and an exhaust tank 57. The exhaust pipe 55 includes one end connected to the exhaust ports 53. The exhaust pipe 55 includes the other end connected to the exhaust tank 57. The pump 56 is interposed with the exhaust pipe 55. The pump 56 sucks and exhausts gas in the treating space A, and introduces the gas into the exhaust tank 57. Consequently, the treating space A is decompressed.

The substrate treating apparatus 1 includes an annular sealing member 59 on the top face of the plate 5. The sealing member 59 is disposed outside the exhaust slit 51. The top face of the plate 5 outside the slit 51 is slightly higher in level than the top face of the plate 5 inside the exhaust slit 51. The sealing member 59 is, for example, an O-ring. When the cover 7 is in the lower position, the undersurface 11 of the cover 7 contacts the sealing member 59. This causes blockage of a lateral side of the treating space A to seal the treating space A.

<Operation>

Figure 6:
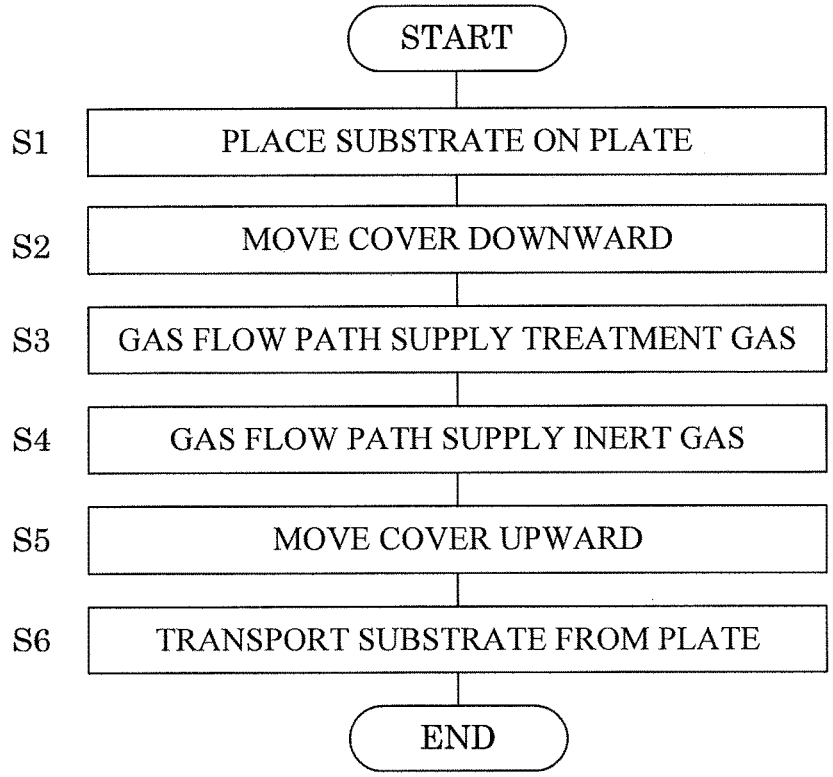
FIG. 6 is a flow chart of procedures of the substrate treating apparatus.

The following describes one non-limiting operational example of the substrate treating apparatus 1. FIG. 6 is a flow chart of procedures of the substrate treating apparatus 1.

<Step S1> Place Substrate on Plate

An external substrate transport mechanism transports one substrate W above the plate 5. Then, the holder pins 43 move upward to receive the substrate W from the substrate transport mechanism. The holder pins 43 move downward to place the substrate W onto the plate 5. More specifically, the substrate W is placed on the proximity balls 41 in a substantially horizontal attitude.

<Step S2> Move Cover Downward

Then the cover 7 moves downward to the lower position. The treating space A is closed. The undersurface 11 approaches to a surface (top face) of the substrate W.

<Step S3> Gas Flow Path Supply Treatment Gas

The pump 56 exhausts the gas from the treating space A, and the temperature regulator 49 controls the temperature of the substrate W in the plate 5 (performs a heat treatment). Accordingly, the treating space A is decompressed, and the substrate W is controlled to a given temperature. Under such a condition, a gas supplying unit, not shown, supplies a treatment gas to the gas flow path 13. The treatment gas flows into the introduction port 33, the swirl chamber 31, the diameter contraction chamber 35, the small diameter chamber 37, and the diameter expansion chamber 39, in this order, and then is discharged into the treating space A. In a strict sense, the treatment gas is discharged to the middle of the surface of the substrate W. The treatment gas is dispersed in the treating space A. More strictly, the treatment gas is dispersed between the surface of the substrate W and the undersurface 11 of the cover 7. When the treatment gas flows over the surface of the substrate W, liquefaction of a hydrophobic treatment agent in the treatment gas occurs on the surface of the substrate W, and the hydrophobic treatment agent subjected to the liquefaction is applied to the substrate W. The treatment gas flows outside the periphery edge of the substrate W, and then is discharged through the exhaust slit 51 and the exhaust ports 53.

The following describes the flow of the treatment gas in detail. The introduction port 33 introduces the treatment gas into the swirl chamber 31 in the direction E. The introduced treatment gas flows along the periphery surface 31a of the swirl chamber 31. That is, the treatment gas flows around the axis V in the swirl chamber 31. As noted above, the introduction port 33 generates a vortex flow (also referred to as a "spiral flow") of the treatment gas in the swirl chamber 31. FIG. 4 schematically illustrates a flow (vortex flow) F of the treatment gas in the swirl chamber 31.

The vortex flow generated in the swirl chamber 31 is allowed to travel in the chambers 35, 37, and 39, for example. Specifically, the vortex flow in the swirl chamber 31 travels into the diameter contraction chamber 35 downward while circling around the axis V. A circling radius of the vortex flow becomes smaller as the vortex flow moves downward. After the vortex flow in the diameter contraction chamber 35 travels into the small diameter chamber 37, the vortex flow around the axis V moves downward with a substantially constant circling radius. After the vortex flow in the small diameter chamber 37 travels into the diameter expansion chamber 39, the vortex flow around the axis V moves downward while the circling radius becomes large. Thereafter, the treatment gas is discharged from the lower end of the diameter expansion chamber 39 (i.e., the opening 13) to the treating space A.

Here, the treatment gas may partially flow linearly in one direction (e.g., downward) without circling in the chambers 31, 35, 37, and 39.

Since a centrifugal force (inertial force) acts on the vortex flow around the axis V, the treatment gas tends to spread actively by itself to the outside in the substantially horizontal direction. Consequently, a direction of the vortex flow discharged from the gas flow path 13 includes, beside a downward component to the center of the substrate W, an outward component in the substantially horizontal direction to the periphery edge of the substrate W. When the treatment gas is discharged from the gas flow path 13, the treatment gas moves downward and actively spreads outward in the substantially horizontal direction. Then, the treatment gas smoothly flows from the center of the substrate W to the periphery edge of the substrate W. Moreover, the treatment gas readily spreads substantially uniformly (substantially concentrically) in every direction from the center of the substrate W. Consequently, this achieves uniform supply of the treatment gas to the entire surface of the substrate W, leading to more uniform application of the hydrophobic treatment agent to the substrate W.

Moreover, the pump 56 exhausts the gas from the treating space A through the exhaust slit 51, whereby the treatment gas over the substrate W is sucked outward to the periphery edge of the substrate W. This allows more enhanced flow of the treatment gas to the periphery edge of the substrate W.

<Step S4> Gas Flow Path Supply Inert Gas

The gas supplying unit, not shown, supplies an inert gas, instead of the treatment gas, to the gas flow path 13. The gas flow path 13 supplies the inert gas to the substrate W. Accordingly, the inert gas is substituted for the treatment gas in the treating space A. Here the step S4 is also performed under a condition in which the treating space A is decompressed and the substrate W has a controlled given temperature.

<Step S5> Move Cover Upward

The cover 7 moves upward.

<Step S6> Transport Substrate from Plate

The holder pins 43 moves upward to lift up the substrate W on the plate 5. The external substrate transport mechanism receives the substrate W held with the holder pins 43, and transports the substrate W from the substrate treating apparatus 1.

As noted above, the gas flow path 13 of the substrate treating apparatus 1 according to the present embodiment includes the swirl chamber 31, the diameter contraction chamber 35, the small diameter chamber 37, and the diameter expansion chamber 39. This allows more uniform supply of the treatment gas to the entire surface of the substrate W.

The swirl chamber 31 has the axis V as the central axis. Consequently, the vortex flow in the swirl chamber 31 travels around the substantially vertical axis V passing through the center of the substrate W. Accordingly, a centrifugal force acts on the treatment gas in an appropriate direction. As a result, this allows the treatment gas to be dispersed suitably from the center of the substrate W to the periphery edge of the substrate W.

The central axes of the diameter contraction chamber 35, the small diameter chamber 37, and the diameter expansion chamber 39 are common to the central axis of the swirl chamber 31 individually. This allows more suitable dispersion of the treatment gas to the periphery edge of the substrate W. Moreover, this allows the treatment gas to flow smoothly in the chambers 31, 35, 37, and 39.

The opening B at the lower end of the diameter expansion chamber 39 faces to the center of the substrate. This allows the gas flow path 13 to supply the treatment gas more uniformly to the entire surface of the substrate W.

The diameter expansion chamber 39 has the inner diameter d4 at the lower end that is larger than the inner diameter d1 of the swirl chamber 31. This allows the diameter expansion chamber 39 to discharge the treatment gas smoothly to the treating space A.

The small diameter chamber 37 ensures an increased speed component of the treatment gas in the vertical downward direction. This obtains a sufficient initial speed of the treatment gas discharged from the gas flow path, leading to dispersion of the treatment gas to the periphery edge of the substrate.

The gas flow path 13 includes the introduction port 33, whereby the vortex flow can be generated suitably in the swirl chamber 31. Specifically, the introduction port 33 introduces the treatment gas into the swirl chamber 31 in the direction E away from the central axis (i.e., the axis V) of the swirl chamber 31. The treatment gas introduced into the swirl chamber 31 starts to flow smoothly along the periphery surface 31a. As noted above, the vortex flow of the treatment gas is readily generated in the swirl chamber 31.

The cover 7 substantially seals the treating space A. This allows the gas flow path 13 to supply the treatment gas more uniformly to the surface of the substrate W.

The substrate treating apparatus 1 includes the exhaust slit 51 and the exhaust ports 53, achieving more enhanced flow of the treatment gas from the center of the substrate W to the periphery edge of the substrate W in plan view. This allows more uniform supply of the treatment gas to the entire surface of the substrate.

Comparison Between Embodiment and Comparative Example

Comparison is made between the gas flow path 13 in the embodiment and a gas flow path in a comparative example in terms of flow of the treatment gas.

Figure 7:
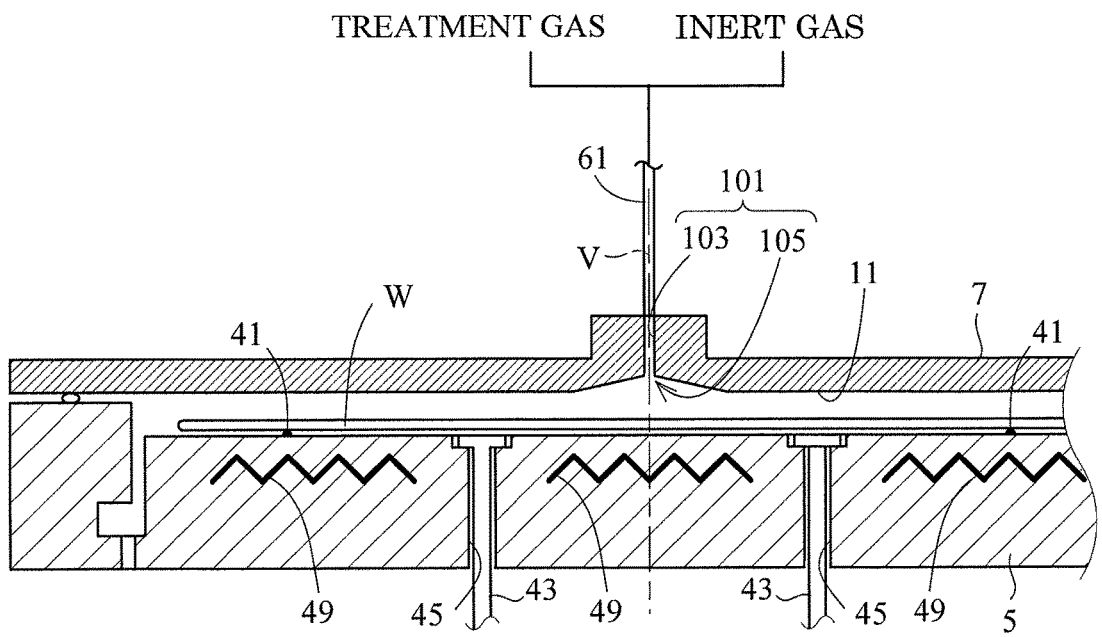
FIG. 7 is a vertical sectional view of a gas flow path in a comparative example.

FIG. 7 is a vertical sectional view of a gas flow path 101 in the comparative example. Here in the comparative example, like numerals are used to identify like components which are the same as in the embodiment. The gas flow path 101 is a so-called straight type. The gas flow path 101 includes a straight flow chamber 103, and a diameter expansion chamber 105. The straight flow chamber 103 is cylindrical around an axis V. The straight flow chamber 103 includes an upper end connected to a first end of the tube 61. The straight flow chamber 103 has an inner diameter substantially equal to an inner diameter of the tube 61. In the straight flow chamber 103, no vortex flow of the treatment gas is generated, and the treatment gas travels downward linearly. The straight flow chamber 103 includes an undersurface that is in fluid communication with a diameter expansion chamber 105. The diameter expansion chamber 105 has an inner diameter that increases from the upper end toward the lower end thereof. The diameter expansion chamber 105 has an opening at the lower end thereof that opens on the undersurface 11. The opening at the lower end of the diameter expansion chamber 105 faces to the center of the surface of the substrate W.

Figure 8A:
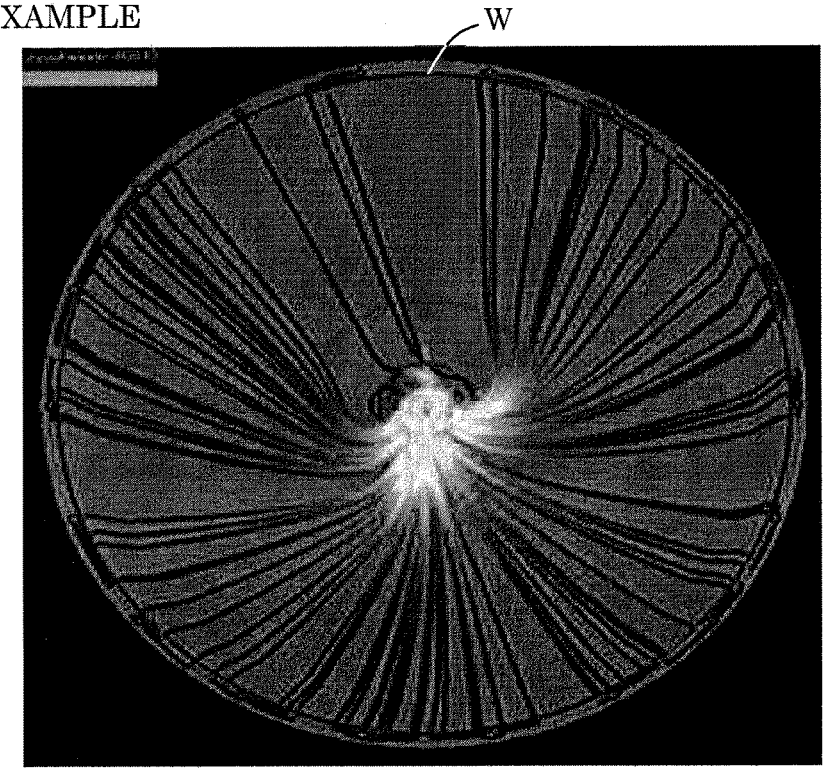
FIG. 8A illustrates flow lines of a treatment gas in the embodiment.
Figure 8A:
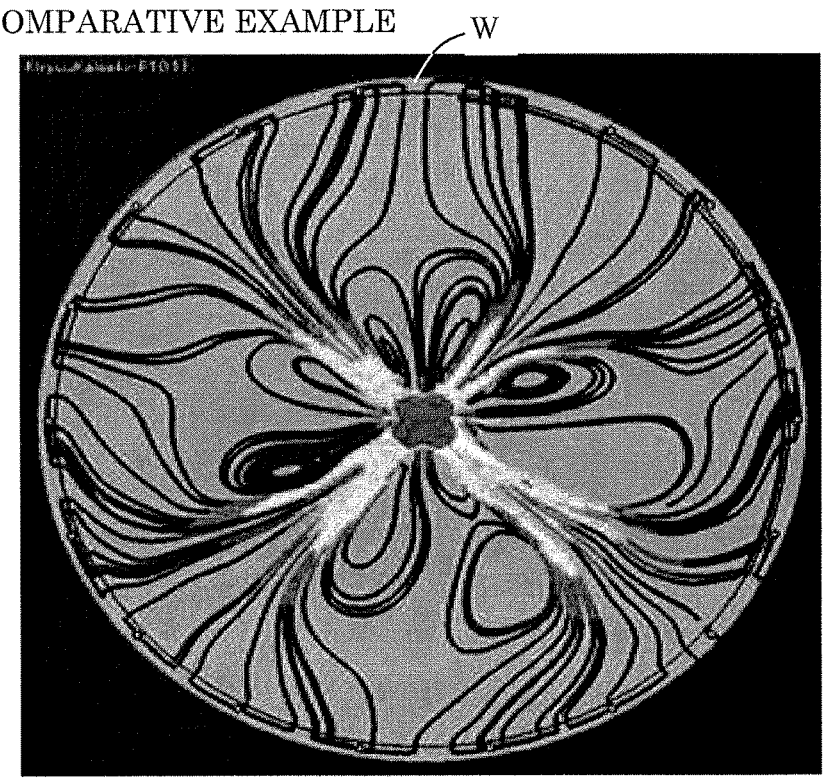

FIG. 8A illustrates simulated flow lines of the treatment gas flowing over the substrate W in the embodiment. FIG. 8B illustrates simulated flow lines of the treatment gas flowing over the substrate W in the comparative example.

As illustrated in FIG. 8A, the treatment gas flows radially from the center of the substrate W to the entire periphery edge of the substrate W. The treatment gas travels substantially linearly in every direction. A distance of the treatment gas from the center to the periphery edge of the substrate W does not vary largely depending on the direction in which the treatment gas travels. Such flow of the treatment gas allows uniform supply of the treatment gas to the surface of the substrate W.

As illustrated in FIG. 8B, in the comparative example, the treatment gas curls at several positions on the substrate W, and accordingly, does not flow radially from the center of the substrate W to the entire periphery edge of the substrate W. Almost the treatment gas flows while bending largely over the substrate W, and thus does not flow linearly. Consequently, a distance of the treatment gas from the center to the periphery edge of the substrate W varies largely depending on the direction in which the treatment gas travels. Such flow of the treatment gas causes an area of the substrate W to which the treatment gas is excessively supplied and another area of the substrate W to which the treatment gas is supplied inadequately on the substrate W. That is, more non-uniform supply of the treatment gas is performed to the surface of the substrate W.

In addition, a speed distribution has been analyzed for the treatment gas that flows over the substrate W. The result, not shown, is that both the embodiment and the comparative example have the common feature that an area at which the speed of the treatment gas is highest includes the center of the substrate W. Note that the area at which the speed of the treatment gas is highest is smaller in the embodiment than in the comparative example. Especially, in the comparative example, the area at which the speed of the treatment gas is highest is distorted and extends in a particular direction from the center of the substrate W. Moreover, the speed of the treatment gas is substantially equal at an area other than the center of the substrate W (e.g., an area separating one-third or more of the radius of the substrate W away from the center of the substrate W) in the embodiment, and thus the speed of the treatment gas varies less than the comparative example. Consequently, a relationship between the distance from the center of the substrate W and the speed of the treatment gas does not vary relatively depending on the direction of the treatment gas from the center of the substrate W. From the above, it is revealed that the treatment gas flows on the substrate W more smoothly in the embodiment than in the comparative example.

<Relationship Between Introduction Flow Rate and Flow of Treatment Gas in Embodiment>

Figure 9A:
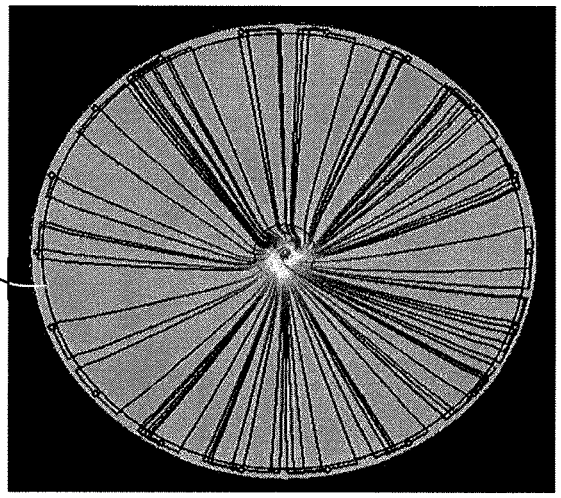
FIGS. 9A, 9B, and 9C each illustrate flow lines of the treatment gas in the embodiment when an introduction flow rate of the treatment gas is 1.5 L/min, 3.0 L/min, and 5.0 L/min, respectively.
Figure 9B:
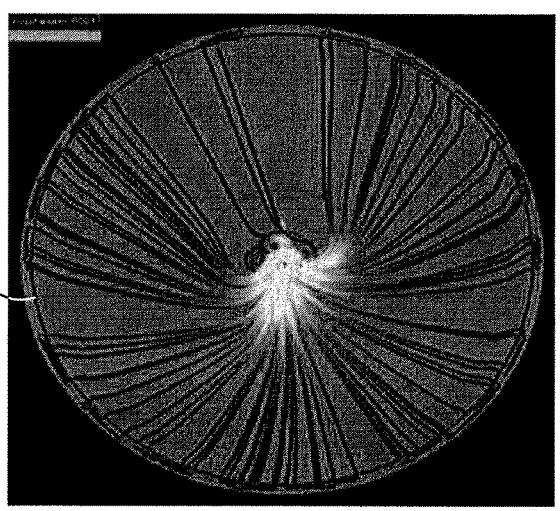
Figure 9C:
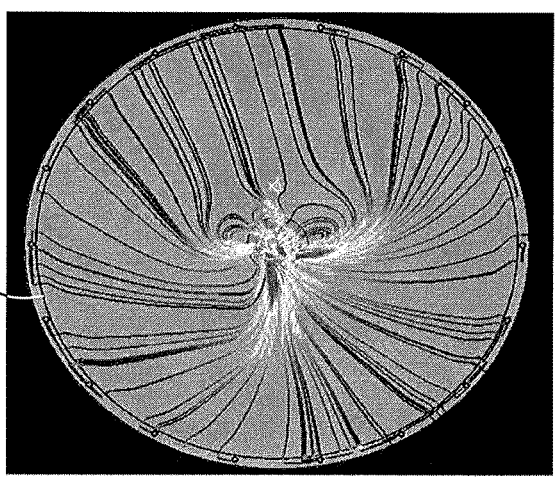
Figure 10A:
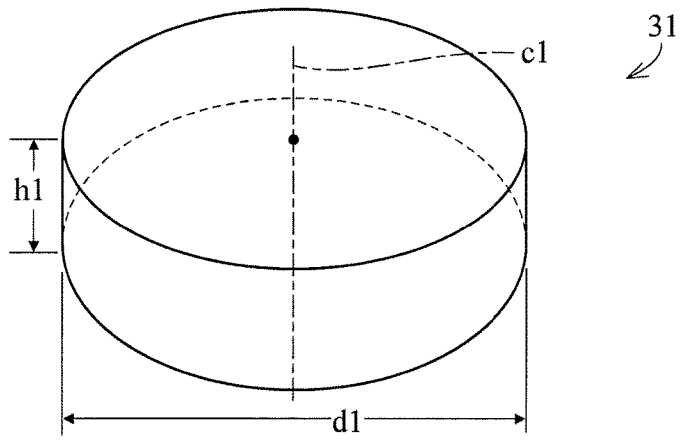
FIGS. 10A, 10B, 10C, and 10D are perspective views of a swirl chamber, a diameter contraction chamber, a small diameter chamber, and a diameter expansion chamber, respectively.
Figure 10B:
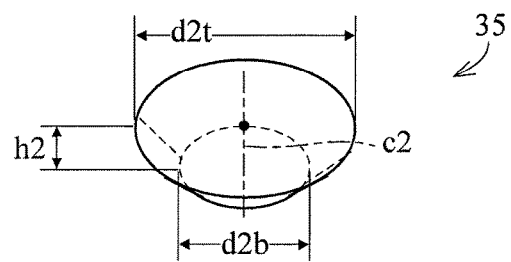
Figure 10C:
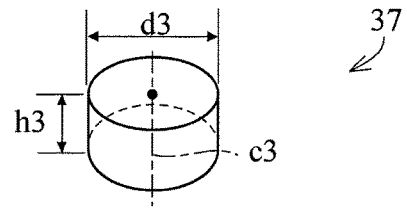
Figure 10D:
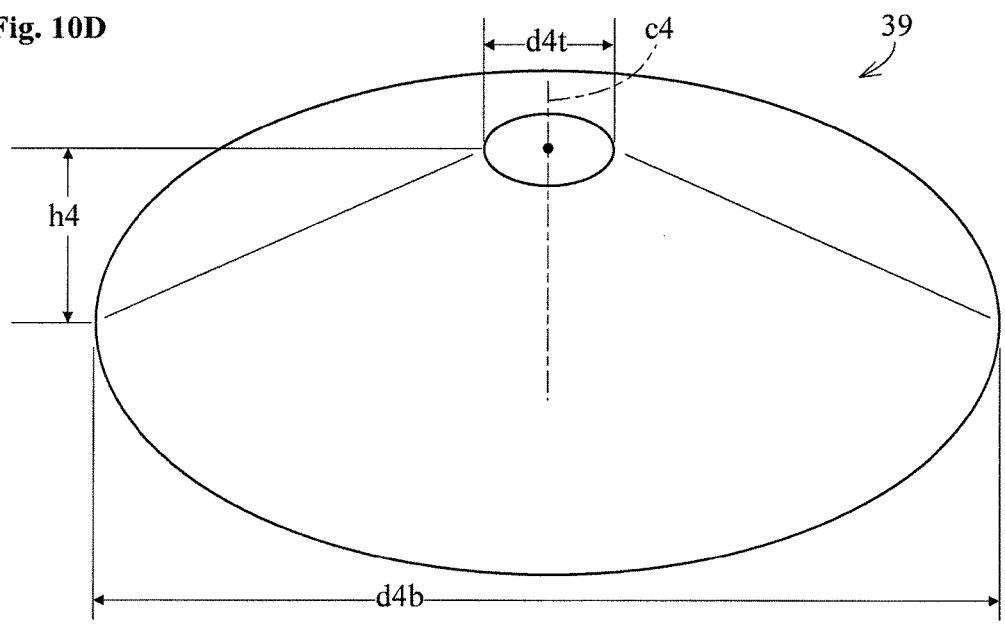

FIGS. 9A, 9B, and 9C each illustrate simulated flow lines of the treatment gas on the substrate W with different flow rates at which the treatment gas is introduced into the gas flow path 13 (hereinunder, referred to as an "introduction flow rate"). FIG. 9A illustrates a case with an introduction flow rate of 1.5 L/min, FIG. 9B with an introduction flow rate of 3.0 L/min, and FIG. 9C with an introduction flow rate of 5.0 L/min.

It is revealed from FIGS. 9A, 9B, and 9C that more uniform flow of the treatment gas is obtainable as the introduction flow rate thereof becomes lower. However, as illustrated in FIG. 9C with the high introduction flow rate, the treatment gas travels substantially linearly from the center to the entire periphery edge of the substrate W, and a distance from the center to the periphery edge of the substrate W does not vary largely depending on the direction in which the treatment gas travels. Consequently, the gas flow path 13 of the present embodiment allows suitable supply of the treatment gas to the entire surface of the substrate W even at any of the introduction flow rates of 1.5 L/min, 3.0 L/min, and 5.0 L/min. That is, the gas flow path 13 in the present embodiment allows more uniform supply of the treatment gas to the entire surface of the substrate W at a wide range of the introduction flow rate.

The present invention is not limited to the foregoing embodiment, but may be modified as follows.

(1) In the embodiment mentioned above, a relationship in terms of a size, for example, among the chambers 31, 35, 37, and 39 is not described in detail, but the following relationship may be set.

FIGS. 10A, 10B, 10C, and 10D illustrate perspective views of the swirl chamber 31, the diameter contraction chamber 35, the small diameter chamber 37, and the diameter expansion chamber 39, respectively.

The inner diameter $d2t$ at the upper end of the diameter contraction chamber 35 may be smaller than the inner diameter $d1$ of the swirl chamber 31. For instance, the inner diameter $d2t$ at the upper end of the diameter contraction chamber 35 may be half or less of the inner diameter $d1$ of the swirl chamber 31. This allows efficient reduction in circling radius of the treatment gas when the treatment gas flows from the swirl chamber 31 to the diameter contraction chamber 35. Alternatively, the inner diameter $d2t$ at the upper end of the diameter contraction chamber 35 may be equal to the inner diameter $d1$ of the swirl chamber 31. This allows smooth flow of the treatment gas from the swirl chamber 31 to the diameter contraction chamber 35.

The inner diameter $d2b$ at the lower end of the diameter contraction chamber 35 may be one-third or less of the inner diameter $d1$ of the swirl chamber 31. This allows the diameter contraction chamber 35 to satisfactorily reduce the circling radius of the treatment gas.

The diameter contraction chamber 35 may have a truncated cone shape. That is, the inner diameter $d2$ of the diameter contraction chamber 35 may decrease at a constant proportion from the upper end of the diameter contraction chamber 35 to the lower end of the diameter contraction chamber 35. This allows more smooth restriction of the circling radius of the treatment gas.

The diameter contraction chamber 35 may have a height $h2$ smaller than a height $h1$ of the swirl chamber 31. For instance, the height $h2$ of the diameter contraction chamber 35 may be half or less than the height $h1$ of the swirl chamber 31. This allows the diameter contraction chamber 35 to reduce the circling radius of the treatment gas sharply.

In the embodiment mentioned above, the inner diameter $d3$ of the small diameter chamber 37 is substantially equal to the inner diameter $d2b$ at the lower end of the diameter contraction chamber 35. However, this is not limitative. For instance, the inner diameter $d3$ of the small diameter chamber 37 may be smaller than the inner diameter $d2b$ at the lower end of the diameter contraction chamber 35. This allows more efficient restriction of the circling radius of the treatment gas when the treatment gas flows from the diameter contraction chamber 35 to the small diameter chamber 37.

The small diameter chamber 37 may have a height $h3$ smaller than a height $h1$ of the swirl chamber 31. This allows the small diameter chamber 37 to suitably suppress excessive increase of a downward speed component of the treatment gas.

The inner diameter $d4t$ at the upper end of the diameter expansion chamber 39 may be substantially equal to the inner diameter $d3$ of the small diameter chamber 37. This allows the treatment gas to flow from the small diameter chamber 37 to the diameter expansion chamber 39 more smoothly. Moreover, the inner diameter $d4t$ at the upper end of the diameter expansion chamber 39 may be smaller than the inner diameter $d3$ of the small diameter chamber 37. This allows more efficient restriction of the circling radius of the treatment gas when the treatment gas flows from the small diameter chamber 37 to the diameter expansion chamber 39. Alternatively, the inner diameter $d4t$ at the upper end of the diameter expansion chamber 39 may be larger than the inner diameter $d3$ of the small diameter chamber 37. This allows relieved restriction of the circling radius of the treatment gas when the treatment gas flows from the small diameter chamber 37 to the diameter expansion chamber 39.

The diameter expansion chamber 39 may have a truncated cone shape. That is, the inner diameter $d4$ of the diameter expansion chamber 39 may increase at a constant proportion from the upper end of the diameter expansion chamber 39 to the lower end of the diameter expansion chamber 39. This allows relieved restriction of the circling radius of the treatment gas more smoothly.

The inner diameter $d4b$ at the lower end of the diameter expansion chamber 39 may be substantially equal to or more than the inner diameter $d2t$ at the upper end of the diameter contraction chamber 35. This allows the diameter expansion chamber 39 to discharge the treatment gas to the treating space A more smoothly.

The diameter expansion chamber 39 may have a height $h4$ larger than the height $h1$ of the swirl chamber 31. This allows the diameter expansion chamber 39 to introduce the treatment gas into the treating space A more smoothly.

In the embodiment mentioned above, the central axis $c1$ of the swirl chamber 31 is common to the axis V. However, this is not limitative. The central axis $c1$ of the swirl chamber 31 may be changed to a substantially vertical axis disposed away from the center of the substrate W. Such a modification obtains enhanced uniformity of supply of the treatment gas to the substrate W as long as the lower end of the diameter expansion chamber 39 faces to the surface of the substrate W.

Similarly, at least any of central axes $c2$, $c3$, and $c4$ of the diameter contraction chamber 35, the small diameter chamber 37, and the diameter expansion chamber 39, respectively, may be changed to a substantially vertical axis disposed away from the center of the substrate W.

In the embodiment mentioned above, the central axes $c1$ to $c4$ of the chambers 31, 35, 37, and 39, respectively, are common. However, this is not limitative. For instance, at least two or more of the central axes $c1$ to $c4$ are not common. Such may be adopted.

(2) In the embodiment mentioned above, the diameter expansion chamber 39 is formed across the nozzle 21 and the cover main body 23. However, this is not limitative. For instance, the diameter expansion chamber 39 may be entirely formed in the nozzle 21. Alternatively, the diameter expansion chamber 39 may be entirely formed in the cover main body 23. That is, the diameter expansion chamber 39 is not necessarily formed in the nozzle 21. In any of the modifications above, it is preferred that the lower end of the diameter expansion chamber 39 is flush with the undersurface 11.

Moreover, in the embodiment mentioned above, the nozzle 21 and the cover main body 23 are individual members that are separable. However, this is not limitative. The nozzle 21 and the cover main body 23 may be formed by one unseparated member. That is, the nozzle 21 and cover main body 23 may be formed integrally.

(3) In the embodiment mentioned above, the gas flow path 13 includes the small diameter chamber 37. However, this is not limitative. That is, the small diameter chamber 37 may be omitted. For instance, the undersurface of the diameter contraction chamber 35 may contact the top face of the diameter expansion chamber 39. Such a modification allows enhanced uniformity of supply of the treatment gas to the substrate W.

(4) The introduction port 33 is a straight flow path. However, this is not limitative. For instance, the introduction port 33 may be a flow path that bends along the periphery surface 31a of the swirl chamber 31. Such a modification allows suitable generation of the vortex flow of the treatment gas in the swirl chamber 31. Moreover, the introduction port 33 is a horizontal flow path. However, this is not limitative. For instance, the introduction port 33 may be a flow path having a gradient relative to a horizontal plane.

(5) The swirl chamber 31 may have a fin attached thereto for guiding the treatment gas. This allows accelerated generation of the vortex flow in the swirl chamber 31. Moreover, when the fin itself allows sufficient generation of the vortex flow in the swirl chamber 31, the introduction port 33 may introduce the treatment gas toward the central axis (axis V) of the swirl chamber 31.

(6) In the embodiment mentioned above, the treatment gas supplied from the gas flow path 13 contains the hydrophobic treatment agent. However, this is not limitative. For instance, the gas flow path 13 may supply a treatment gas containing a solvent.

As noted above, the gas flow path 13 allows supply of various types of the treatment gas. Accordingly, the substrate treating apparatus 1 may be replaced with an apparatus that performs treatment other than the hydrophobic treatment. For instance, the substrate treating apparatus 1 may be replaced with an apparatus that supplies the treatment gas to a substrate W having a resist film formed thereon. Moreover, the substrate treating apparatus 1 may be replaced with an apparatus that supplies the treatment gas to a substrate W before or after subjection to exposure or to development. For instance, the substrate treating apparatus 1 may be replaced with an apparatus that supplies the treatment gas to a substrate W having a DSA (Directed Self Assembly) film formed thereon, the substrate W being treated by applying thereto a self-assembly material used for a DSA technology. It is preferred that the treatment gas contains a solvent when the substrate W on which the DSA film is formed is processed. The solvent is preferably at least one or more selected from toluene, heptane, acetone, propylene glycol monomethyl ether acetate, propylene glycol monomethyl ether, cyclohexanone, carbon disulfide, and tetrahydrofuran.

(7) The present embodiments and the modifications in the above (1) to (6) may be variable appropriately by replacing or combining the elements of the present embodiments or the modifications with the other thereof.

The present invention may be embodied in other specific forms without departing from the spirit or essential attributes thereof and, accordingly, reference should be made to the appended claims, rather than to the foregoing specification, as indicating the scope of the invention.

What is claimed is:
1. A substrate treating apparatus, comprising:
a plate that places a substrate thereon horizontally; and
a cover that covers an upper side of the substrate on the plate, the cover comprising:
an undersurface that is horizontal and adjacent to a surface of the substrate; and
a gas flow path through which a treatment gas is supplied to the substrate, the gas flow path comprising:
a swirl chamber having a cylindrical shape with a vertical central axis, and in which the treatment gas flows around the central axis;
a diameter contraction chamber disposed below the swirl chamber and in communication with the swirl chamber, and whose inner diameter decreases from its upper end toward its lower end; and
a diameter expansion chamber disposed below the diameter contraction chamber and in communication with the diameter contraction chamber, whose inner diameter increases from its upper end toward its lower end, and the lower end of the diameter expansion chamber includes an opening on the undersurface of the cover, and
the swirl chamber has a circular horizontal section.

2. The substrate treating apparatus according to claim 1, wherein
the central axis of the swirl chamber passes through the substantial center of the substrate on the plate.

3. The substrate treating apparatus according to claim 1, wherein
the central axis of the diameter contraction chamber is common to the central axis of the swirl chamber, and
the central axis of the diameter expansion chamber is common to the central axis of the swirl chamber.

4. The substrate treating apparatus according to claim 1, wherein
the opening on the lower end of the diameter expansion chamber faces to the center of the substrate.

5. The substrate treating apparatus according to claim 1, wherein
the inner diameter at the lower end of the diameter expansion chamber is larger than the inner diameter of the swirl chamber.

6. The substrate treating apparatus according to claim 1, further comprising:
a first chamber disposed between the diameter contraction chamber and the diameter expansion chamber, wherein
the first chamber has a cylindrical shape whose inner diameter is equal to or less than the inner diameter at the lower end of the diameter contraction chamber, and
the internal diameter of the first chamber is constant from its upper end to its lower end.

7. The substrate treating apparatus according to claim 1, further comprising:
an introduction port that introduces the treatment gas into the swirl chamber in a direction away from the central axis of the swirl chamber.

8. The substrate treating apparatus according to claim 1, wherein
the cover seals a treating space on the plate.

9. The substrate treating apparatus according to claim 1, further comprising:
an exhaust channel for exhausting the gas over the substrate placed on the plate outward from the periphery edge of the substrate.

10. The substrate treating apparatus according to claim 1, wherein
the internal diameter of the swirl chamber is constant from its upper end to its lower end.

11. The substrate treating apparatus according to claim 1, wherein
the inner diameter at the upper end of the diameter contraction chamber is smaller than the inner diameter of the swirl chamber.

12. The substrate treating apparatus according to claim 11, wherein
the inner diameter at the upper end of the diameter contraction chamber is half or less of the inner diameter of the swirl chamber.

13. The substrate treating apparatus according to claim 12, wherein
the inner diameter at the lower end of the diameter contraction chamber is one-third or less of the inner diameter of the swirl chamber.

14. The substrate treating apparatus according to claim 1, wherein
the diameter contraction chamber has a height smaller than a height of the swirl chamber.

15. The substrate treating apparatus according to claim 14, wherein
the height of the diameter contraction chamber is half or less than the height of the swirl chamber.

16. The substrate treating apparatus according to claim 1, wherein
a periphery surface at an upper part of the diameter expansion chamber differs from the periphery surface at a lower part thereof in inclined angle.

17. The substrate treating apparatus according to claim 16, wherein
an inclined angle of the periphery surface at the lower part of the diameter expansion chamber is closer to a horizontal plane than an inclined angle of the periphery surface at the upper part of the diameter expansion chamber.

18. The substrate treating apparatus according to claim 16, wherein
the gas flow path is formed by a nozzle and a cover main body,
the upper part of the diameter expansion chamber is formed in the nozzle, and
the lower part of the diameter expansion chamber is formed in the cover main body.

19. The substrate treating apparatus according to claim 1, wherein
the first chamber has a height smaller than a height of the swirl chamber.

* * * * *